US010559638B2

(12) United States Patent
Su et al.

(10) Patent No.: US 10,559,638 B2
(45) Date of Patent: Feb. 11, 2020

(54) DISPLAY PANEL HAVING VARIOUS LAYERS OVERLAPING ONE ANOTHER IN VERTICAL DIRECTION AND A METHOD FOR FORMING THE SAME

(71) Applicants: SHANGHAI TIANMA AM-OLED CO., LTD., Shanghai (CN); TIANMA MICRO-ELECTRONICS CO., LTD., Shenzhen (CN)

(72) Inventors: Congyi Su, Shanghai (CN); Junxiong Fang, Shanghai (CN)

( * ) Notice: Subject to any disclaimer, the term of this patent is extended or adjusted under 35 U.S.C. 154(b) by 0 days.

(21) Appl. No.: 15/195,227

(22) Filed: Jun. 28, 2016

(65) Prior Publication Data

US 2017/0154938 A1 Jun. 1, 2017

(30) Foreign Application Priority Data

Nov. 30, 2015 (CN) .......................... 2015 1 0862357

(51) Int. Cl.
*H01L 27/32* (2006.01)
*H01L 51/52* (2006.01)
(Continued)

(52) U.S. Cl.
CPC ...... *H01L 27/3262* (2013.01); *H01L 51/0097* (2013.01); *H01L 51/5246* (2013.01);
(Continued)

(58) Field of Classification Search
CPC ... H01L 27/32; H01L 51/524; H01L 51/5246; H01L 51/525; H01L 51/56
See application file for complete search history.

(56) References Cited

U.S. PATENT DOCUMENTS

2002/0024096 A1* 2/2002 Yamazaki ........... H01L 27/1214
257/359
2006/0158108 A1* 7/2006 Hayashi .............. H01L 51/5246
313/506
(Continued)

FOREIGN PATENT DOCUMENTS

| CN | 104064674 A | 9/2014 |
| CN | 104377225 A | 2/2015 |
| TW | 201133431 A | 10/2011 |

OTHER PUBLICATIONS

The First Office Action dated Sep. 28, 2017 regarding the Chinese priority patent application (Appl. No. 201510862357.5).

*Primary Examiner* — Anh D Mai
(74) *Attorney, Agent, or Firm* — Kilpatrick Townsend & Stockton, LLP

(57) ABSTRACT

A display panel and a method for fabricating the same are provided. The display panel includes: a TFT array substrate; an OLED array disposed on the TFT array substrate, a package layer which covers the OLED array, an upper protection layer covering the package layer, and a lower protection layer. In a first direction, a first projection of the OLED array on the TFT array substrate is located within a second projection of the package layer on the TFT array substrate, and there is a first distance between a boundary of the first projection and a boundary of the second projection. Also in the first direction, the second projection is located within a third projection of the upper protection layer on the TFT array substrate, and there is a second distance between the boundary of the second projection and a boundary of the third projection.

13 Claims, 3 Drawing Sheets

(51) Int. Cl.
*H01L 51/00* (2006.01)
*H01L 51/56* (2006.01)

(52) U.S. Cl.
CPC .......... *H01L 51/5253* (2013.01); *H01L 51/56* (2013.01); *Y02E 10/549* (2013.01); *Y02P 70/521* (2015.11)

(56) References Cited

U.S. PATENT DOCUMENTS

| | | | |
|---|---|---|---|
| 2008/0180022 A1* | 7/2008 | Kwack | B82Y 20/00 313/504 |
| 2011/0235160 A1 | 9/2011 | Hsieh et al. | |
| 2013/0248891 A1 | 9/2013 | Kim et al. | |
| 2015/0048331 A1 | 2/2015 | Kwack et al. | |

* cited by examiner

DISPLAY PANEL HAVING VARIOUS LAYERS OVERLAPING ONE ANOTHER IN VERTICAL DIRECTION AND A METHOD FOR FORMING THE SAME

CROSS REFERENCE TO RELATED APPLICATIONS

The present application claims the priority to Chinese Patent Application No. 201510862357.5, titled "DISPLAY PANELS AND METHODS FOR FABRICATING THE SAME", filed on Nov. 30, 2015 with the State Intellectual Property Office of People's Republic of China, which is incorporated herein by reference in its entirety.

FIELD

The present disclosure relates to the technical field of display device, and in particular to a display panel and a method for fabricating the same.

BACKGROUND

With the constant development of science and technology, more and more electronic display devices are widely used in people's daily life and work, which brings great convenience to people's daily life and work, and the display devices become indispensible and important tools in people's daily life and work today.

The main component of the electronic display device is a display panel, and an OLED display panel becomes one of mainstream display panels nowadays due to advantages such as a wide viewing angle, an even image quality, a fast response speed, a colorful display and a simple process.

It is required to protect the OLED display panel by packaging, to avoid aging of a function layer caused by vapor intrusion. However, the protection package of a conventional display panel has a poor seal effect, and the conventional display panel has a short service life.

SUMMARY

To solve the problem above, a display panel and a method for fabricating the same are provided according to the present disclosure, which improves the seal effect of the package protection of the display panel, and prolongs the service life of the display panel.

For solving the problem above, the following technical solutions are provided according to the present disclosure.

A display panel is provided, which includes a thin film transistor (TFT) array substrate, an organic light emitting diode (OLED) array disposed on the TFT array substrate, a package layer covering the OLED array, an upper protection layer covering the package layer, a lower protection layer arranged at a side of the TFT array substrate away from the OLED array. In a first direction perpendicular to the TFT array substrate, a first projection of the OLED array on the TFT array substrate is located within a second projection of the package layer on the TFT array substrate, and there is a first distance between a boundary of the first projection and a boundary of the second projection. Also in the first direction, the second projection is located within a third projection of the upper protection layer on the TFT array substrate, and there is a second distance between the boundary of the second projection and a boundary of the third projection.

A method for fabricating a display panel is further provided according to the present disclosure. The method includes:

providing a TFT array substrate;
forming an OLED array on a surface of the TFT array substrate;
forming a package layer on a surface of the OLED array, where the package layer covers the OLED array, in a first direction, a first projection of the OLED on the TFT array substrate is located within a second projection of the package layer on the TFT array substrate, and there is a first distance between a boundary of the first projection and a boundary of the second projection, where the first direction is perpendicular to the TFT array substrate; and
forming an upper protection layer on a surface of the package layer, and forming a lower protection layer at a side of the TFT array substrate away from the OLED array, where, in the first direction, the second projection is located within a third projection of the upper protection layer on the TFT array substrate, and there is a second distance between the boundary of the second projection and a boundary of the third projection.

According to the descriptions above, the display panel according to the present disclosure includes: a TFT array substrate; an OLED array, which is disposed on the TFT array substrate; a package layer, which covers the OLED array, where, in a first direction, a first projection of the OLED on the TFT array substrate is located within a second projection of the package layer on the TFT array substrate, and there is a first distance between a boundary of the first projection and a boundary of the second projection; an upper protection layer, which covers the package layer, where, in the first direction, the second projection is located within a third projection of the upper protection layer on the TFT array substrate, and there is a second distance between the boundary of the second projection and a boundary of the third projection; and a lower protection layer, which is arranged at a side of the TFT array substrate away from the OLED array, where the first direction is perpendicular to the TFT array substrate.

In the display panel according to the embodiments of the disclosure, there are the first distance and the second distance. The first distance can effectively prevent vapor from intruding through a space between the package layer and the OLED array, and the second distance can effectively prevent vapor from intruding through a space between the upper protection layer and the package layer, such that aging of the display panel caused by vapor intrusion are effectively prevented, and the packaging protection of the display panel has a good seal effect, which prolongs the service life of the display panel.

BRIEF DESCRIPTION OF THE DRAWINGS

To illustrate technical solutions according to embodiments of the disclosure or in the conventional technology more clearly, the following briefly describes the drawings according to embodiments of the disclosure. Apparently, the drawings are only some embodiments of the present disclosure, and other drawings may be obtained by those skilled in the art according to those drawings without creative efforts.

DETAILED DESCRIPTION

The technical solutions of embodiments of the disclosure will be illustrated clearly and completely in conjunction with the drawings of the embodiments of the disclosure. Apparently, the described embodiments are only a few embodiments rather than all embodiments of the disclosure. Any other embodiments obtained by those skilled in the art on the basis of the embodiments of the present disclosure without creative work will fall within the scope of the present disclosure.

As described in the background section, package of a conventional OLED display panel has a poor seal effect such that vapor can easily intrude the package, thereby resulting in problems such as damp aging and oxidation aging of a functional layer of the display panel. This can cause a short service life of the display panel.

Figure 1:
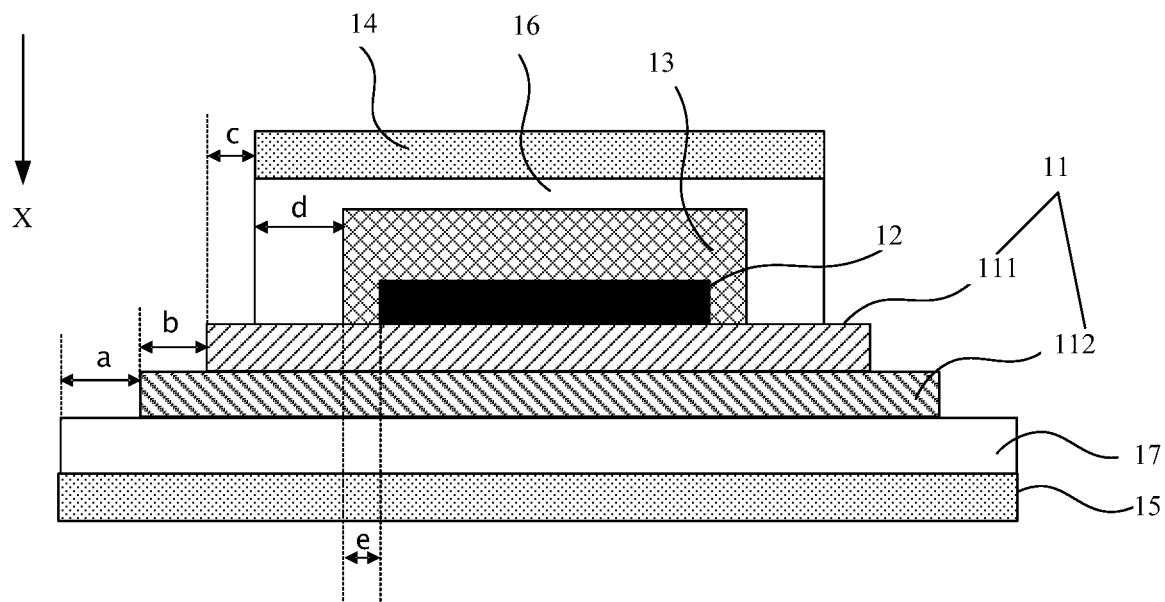
FIG. 1 is a schematic structural diagram of a display panel according to an embodiment of the disclosure.

For solving the problems above, a display panel is provided according to an embodiment of the invention, as shown in FIG. 1.

FIG. 1 is a schematic structural diagram of a display panel according to the embodiment. As shown, in this embodiment, the display panel includes: a TFT array substrate 11; an OLED array 12; a package layer 13; an upper protection layer 14; and a lower protection layer 15. As also shown, the OLED array 12 is disposed on the TFT array substrate 11. The package layer 13 covers the OLED array 12. The upper protection layer 14 covers the package layer 13. The protection layer 15 is arranged at a side of the TFT array substrate 11 away from the OLED array As still shown, in a first direction X, a first projection of the OLED array 12 on the TFT array substrate is located within a second projection of the package layer 13 on the TFT array substrate 11. As can be seen, there is a first distance e between a boundary of the first projection and a boundary of the second projection. In the first direction X. The second projection is located within a third projection of the upper protection layer 14 on the TFT array substrate 11, and there is a second distance d between the boundary of the second projection and a boundary of the third projection. The first direction X is perpendicular to the TFT array substrate 11.

In the display panel according to the embodiment of the disclosure, there are the first distance and the second distance. The first distance can effectively prevent vapor from intruding through a space between the package layer and the OLED array, and the second distance can effectively prevent vapor from intruding through a space between the upper protection layer and the package layer. This can prevent damp aging and oxidation aging of the display panel caused by vapor intrusion. The packaging protection of the display panel has a good seal effect, and thus can prolong the service life of the display panel.

As also shown in FIG. 1, the TFT array substrate 11 may include: a substrate 112 and a TFT array 111 disposed on a surface of the substrate 112. The TFT array 111 is arranged at a side of the substrate 112 facing the OLED array 12.

As still shown in FIG. 1, In the first direction X, a fourth projection of the TFT array 111 on the lower protection layer 15 is located within a fifth projection of the substrate 112 on the lower protection layer 15, and there is a third distance b between a boundary of the fourth projection and a boundary of the fifth projection. There is a fourth distance a between the boundary of the fourth projection and a boundary of the lower protection layer 15. The fourth projection and the fifth projection are both located on the lower protection layer 15.

As also shown in FIG. 1 In the first direction X, there is a fifth distance c between a boundary of a sixth projection of the upper protection layer 14 on the substrate 112 and a boundary of the TFT array layer 11. The sixth projection is located on the TFT array 11.

It should be noted that in the embodiments according to the present disclosure, a distance between boundaries of two projections is the minimum distance between the boundaries of the two projections.

The third distance b can effectively prevent vapor from intruding through a space between the substrate 112 and the TFT array 111. The fourth distance a can effectively prevent vapor from intruding through a space between the substrate 112 and the lower protection layer 15. The fifth distance c can effectively prevent vapor from intruding through a space between the upper protection layer 14 and the package layer 13 or between the upper protection layer and the TFT array 111. Thus, aging of the display panel due to vapor intrusion can be effectively prevented, and the packaging protection of the display panel has a good seal effect, which prolongs the service life of the display panel.

In the display panel according to another embodiment of the disclosure, an echelon protection structure is arranged such that vapor intrusion through a space between two structural layers is effectively prevented. Damp aging and oxidation aging of the display panel are thus avoided, and the service life of the display panel is prolonged.

In certain embodiments, the first distance e is greater than 0.3 mm; the second distance d is greater than 0.2 mm; the third distance b is greater than 0.1 mm; the fourth distance a is greater than 0.1; and the fifth distance c is greater than 0.1 mm. By designing the display panel with these distances, the vapor intrusion through a space between two corresponding structural layers can be effectively prevented, and the effect of the seal protection can be improved.

In still another embodiment according to the present disclosure, the upper protection layer 14 is bonded with the package layer 13 and the TFT array 111 through an upper glue layer 16; and the lower protection layer 15 is bonded with the substrate 112 through a lower glue layer 17. In the first direction X, a boundary of the top glue layer 16 is flush with a boundary of the upper protection layer 14, and a boundary of the lower glue layer 17 is flush with a boundary of the lower protection layer 15.

Figure 2:
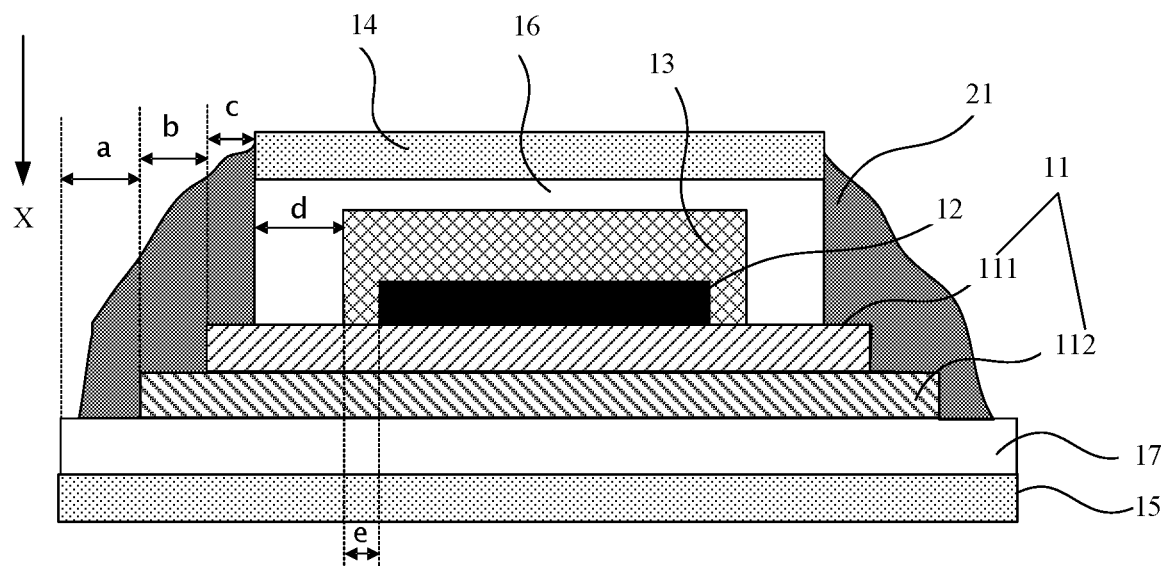
FIG. 2 is a schematic structural diagram of a display panel according to another embodiment of the disclosure.

Reference is made to FIG. 2, which is a schematic structural diagram of a display panel according to another embodiment of the disclosure. In addition to the structures of the display panel shown in FIG. 1, the display panel shown in FIG. 2 further includes a first lateral protection layer 21.

As shown, in this embodiment, the first lateral protection layer 21 covers a portion of the TFT array 111 not covered by the upper protection layer, covers a portion of the substrate 112 not covered by the TFT array, and covers at least a portion of the lower protection layer 15 not covered by the substrate 112.

In the embodiment shown in FIG. 2, the vapor intrusion through a space between two structural layers can be further prevented by arranging the first lateral protection layer 21, which further improves the effect of seal protection of the display panel, better avoids damp aging and oxidation aging of the structural layers of the display panel and further prolongs the service life of the display panel.

Figure 3:
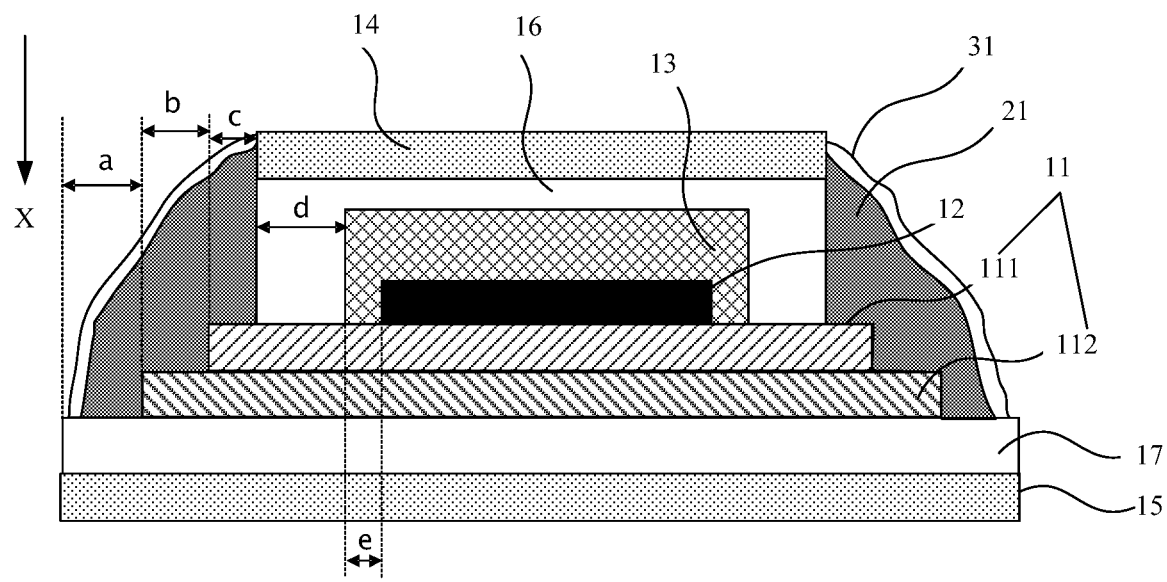
FIG. 3 is a schematic structural diagram of a display panel according to yet another embodiment of the disclosure.

Reference is made to FIG. 3, which is a schematic structural diagram of a display panel according to another embodiment of the disclosure. In addition to the structures of the display panel shown in FIG. 2, the display panel shown in FIG. 3 further includes a second lateral protection layer 31. The second lateral protection layer 31 covers the first lateral protection layer 21.

In the embodiment shown in FIG. 3, the vapor intrusion through a space between two structural layers can be further prevented by the second lateral protection layer 31, which further improves the effect of seal protection of the display panel, better avoids damp aging and oxidation aging of the structural layers of the display panel and further prolongs the service life of the display panel.

In some embodiments, the second lateral protection layer 22 may be an $Al_2O_3$ film thicker than 0.03 mm, and the first lateral protection layer 21 may be a sealant.

Figure 4:
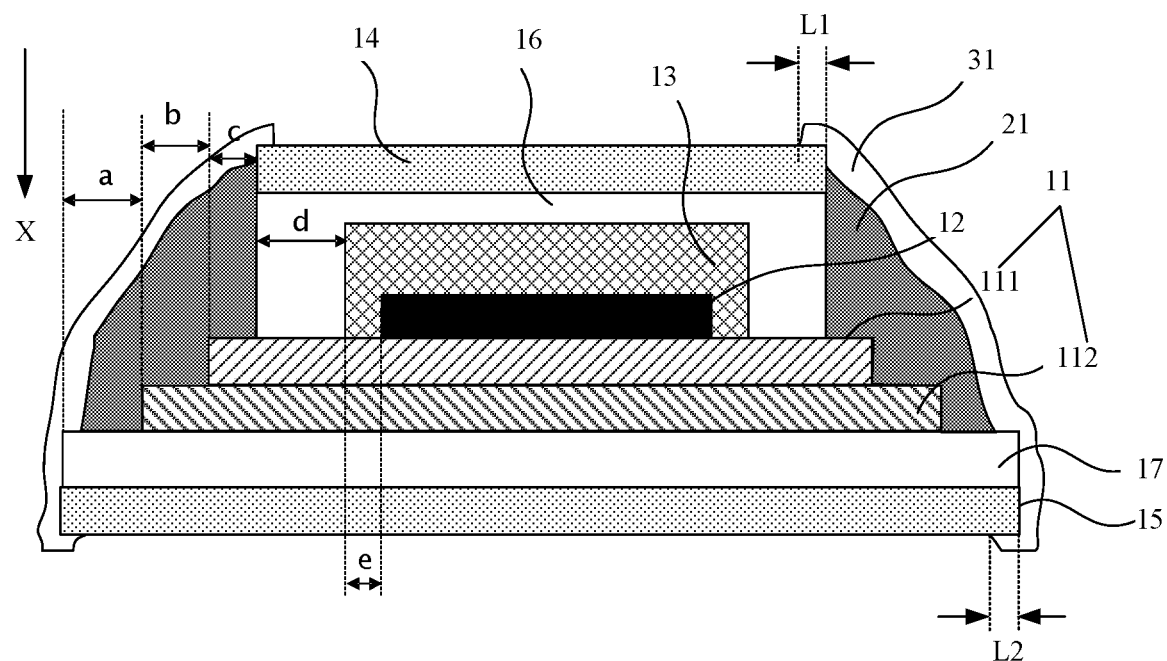
FIG. 4 is a schematic structural diagram of a display panel according to yet another embodiment of the invention.

Reference is made to FIG. 4, which is a schematic structural diagram of a display panel according to another embodiment of the disclosure. In the embodiment shown in FIG. 4, for achieving a good package protection effect and more effectively preventing the vapor intrusion, the first lateral protection layer 21 is arranged to cover an interface between the upper glue layer 16 and the upper protection layer 14; and the second lateral protection layer 31 is arranged to cover an interface between the lower glue layer 17 and the lower protection layer 15, to cover an edge portion of a surface of the lower protection layer 15 away from the lower glue layer 17, and to cover an edge portion of a surface of the upper protection layer 14 away from the upper glue layer 16. The lower glue layer 17 has a predetermined width L2. The upper protection layer 14 has a predetermined width L1

In certain embodiments, the predetermined width L1 and the predetermined width L2 are both greater than 0.1 mm and smaller than the fourth distance a.

In the embodiment according to the present disclosure, the substrate 112 is a flexible substrate. The flexible substrate may be a plastic substrate, so that the display panel can be bended, and can be used to fabricate a bendable display panel.

According to the descriptions above, the display panel according to the embodiment of the present disclosure has a good effect of package protection, which can effectively prevent vapor intrusion, prevent damp aging and oxidation aging of the structural layers and effectively prolong the service life of the display panel.

Figure 5:
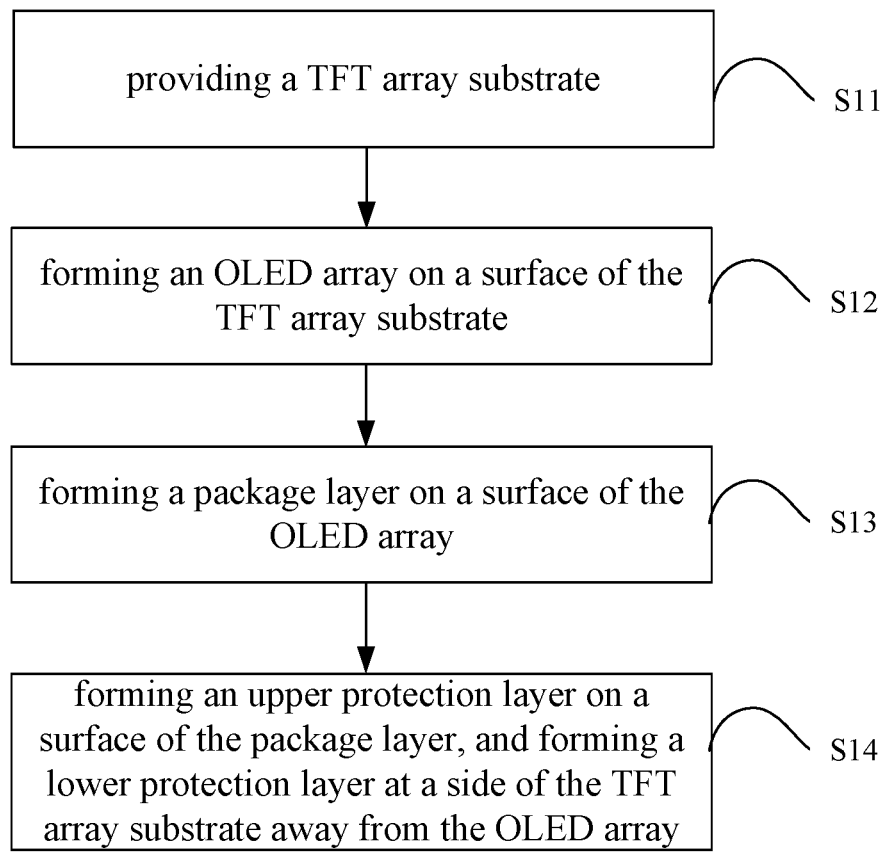
FIG. 5 is a flowchart of a method for fabricating a display panel according to an embodiment of the disclosure.

Based on the embodiments of the display panel, as shown in FIG. 5, a method for fabricating a display panel is provided according to an embodiment of the disclosure.

Reference is made to FIG. 5, which is a flowchart of a method for fabricating a display panel according to an embodiment of the disclosure. The method includes steps S11 to S14.

At step S11 a TFT array substrate is provided.

The structure of the TFT array substrate may refer to the embodiments illustrated and described herein, which can include a substrate and a TFT array disposed on a surface of the substrate. A third distance b may be arranged between the TFT array and a boundary of the substrate.

At step S12 an OLED array on a surface of the TFT array substrate is formed.

The OLED array may be formed on the surface of the TFT array substrate through an evaporation process. The TFT array is located between the OLED array and the substrate.

At step S13 a package layer on a surface of the OLED array is formed.

The package layer is formed by a film packaging process, and the package layer may be a multilayer structure, which includes multiple alternatively distributed organic layers and inorganic layers.

The package layer covers the OLED array. In a first direction, a first projection of the OLED array on the TFT array substrate is located within a second projection of the package layer on the TFT array substrate, and there is a first distance between a boundary of the first projection and a boundary of the second projection, where the first direction is perpendicular to the TFT array substrate.

At step S14, an upper protection layer on a surface of the package layer is formed and a lower protection layer is formed at a side of the TFT array substrate away from the OLED array.

In the first direction, the second projection is located within a third projection of the upper protection layer on the TFT array substrate, and there is a second distance between the boundary of the second projection and a boundary of the third projection.

In order to improve the effect of package protection, the method can further include: a first lateral protection layer. the first lateral protection layer can cover a portion of the TFT array which is not covered by the upper protection layer, covers a portion of the substrate which is not covered by the TFT array, and covers at least a portion of the lower protection layer which is not covered by the substrate.

In order to improve the effect of package protection, the method can further include forming a second lateral protection layer. The second lateral protection layer can cover the first lateral protection layer.

A diagram of a final structure of the display panel fabricated by the method according to the embodiment of the disclosure may refer to the display panel shown in FIGS. 1 to 4.

It should be noted that the method according to the embodiment of the disclosure is used to fabricate the display panel according to the embodiments, structural diagrams of the display panel can refer to the drawings of the embodiments of the display panel, and one embodiment can refer to other embodiments for the same or similar parts, which are not described herein.

The method according to the embodiment of the disclosure can be used to fabricate the display panel according to the foregoing embodiments, and the display panel has a good effect of package protection and a long service life.

The description of the embodiments disclosed herein enables those skilled in the art to implement or use the present disclosure. Numerous modifications to the embodiments are apparent to those skilled in the art, and the general principle herein can be implemented in other embodiments without deviation from the spirit or scope of the present disclosure. Therefore, the present disclosure is not limited to the embodiments described herein, but in accordance with the widest scope consistent with the principle and novel features disclosed herein.

The invention claimed is:
1. A display panel, comprising:
 a thin film transistor array substrate (TFT array substrate), comprising a substrate and a TFT array disposed on a surface of the substrate,
 an organic light emitting diode (OLED) array, wherein the OLED array is disposed on the TFT array;
 a package layer covering the OLED array;
 an upper glue layer covering the package layer;
 an upper protection layer covering the upper glue layer;

a lower glue layer, arranged at a side of the TFT array substrate away from the OLED array;

a lower protection layer arranged at a side of the lower glue layer away from the TFT array substrate; and a first lateral protection layer;

wherein the first lateral protection layer covers and directly contacts with a portion of a surface of the TFT array facing towards the upper protection layer, the portion of the surface of the TFT array is not covered by the upper protection layer, wherein the first lateral protection layer covers and directly contacts with a portion of a surface of the substrate facing towards the upper protection layer, the portion of the surface of the substrate is not covered by the TFT array, wherein the first lateral protection layer covers and directly contacts with at least a portion of a surface of the lower glue layer facing towards the upper protection layer, the portion of the surface of the lower glue layer is not covered by the substrate;

wherein, in a first direction, a first projection is located within a second projection, wherein the first projection indicates a first area in the TFT array where the OLED array is projected on the TFT array, the second projection indicates a second area in the TFT array where the package layer is projected on the TFT array, and there is a first distance between a boundary of the first projection and a boundary of the second projection;

wherein, in the first direction, the second projection is located within a third projection, wherein the third projection indicates a third area in the TFT array where the upper protection layer is projected on the TFT array, and there is a second distance between the boundary of the second projection and a boundary of the third projection;

wherein, in the first direction, the TFT array encloses the third projection and there is a fifth distance between a boundary of the third projection and a boundary of the TFT array;

wherein, in the first direction, the substrate encloses a fifth projection, wherein the fifth projection indicates a fifth area in the substrate where the TFT array is projected on the substrate, and there is a third distance between a boundary of the fifth projection and a boundary of the substrate;

wherein, in the first direction, the lower protection layer encloses a sixth projection, wherein the sixth projection indicates a sixth area in the lower protection layer where the substrate is projected on the lower protection layer, and there is a fourth distance between the boundary of the sixth projection and a boundary of the lower protection layer;

wherein, in the first direction, a seventh projection of the first lateral protection layer on the TFT array indicates a seventh area in the TFT array where the first lateral protection layer is projected on the TFT array, and a boundary of the first lateral protection layer contacts with a boundary of the upper protection layer;

wherein the first direction is perpendicular to the TFT array substrate; wherein the first distance, the second distance, the third distance, the fourth distance and the fifth distance are greater than zero;

wherein the upper protection layer is bonded with the package layer and the TFT array through the upper glue layer, and the lower protection layer is bonded with the substrate through the lower glue layer, wherein the upper protection layer and the upper glue layer are directly contacted, and wherein the third projection and an eighth projection are fully overlapped with each other;

wherein, in the first direction, a boundary of the upper glue layer is flush with a boundary of the upper protection layer, and a boundary of the lower glue layer is flush with a boundary of the lower protection layer.

2. The display panel according to claim 1, wherein the first distance is greater than 0.3 mm, the second distance is greater than 0.2 mm, the third distance is greater than 0.1 mm, the fourth distance is greater than 0.1, and the fifth distance is greater than 0.1 mm.

3. The display panel according to claim 1, further comprising a second lateral protection layer, wherein the second lateral protection layer covers the first lateral protection layer.

4. The display panel according to claim 3, wherein the second lateral protection layer is an $Al_2O_3$ film and the $Al_2O_3$ film is thicker than 0.03 mm.

5. The display panel according to claim 1, wherein the first lateral protection layer covers an interface between the upper glue layer and the upper protection layer, and a second lateral protection layer covers an interface between the lower glue layer and the lower protection layer, covers an edge portion of a surface of the lower protection layer away from the lower glue layer, the lower glue layer having a first predetermined width, and covers an edge portion of a surface of the upper protection layer away from the upper glue layer, the upper glue layer having a second predetermined width.

6. The display panel according to claim 5, wherein the first and second predetermined widths are greater than 0.1 mm and less than the fourth distance.

7. The display panel according to claim 1, wherein the substrate is a flexible substrate.

8. A method for fabricating a display panel, the method comprising:

providing a substrate and providing a TFT array on a surface of the substrate to form a TFT array substrate;

forming an OLED array on a surface of the TFT array;

forming a package layer on a surface of the OLED array, the package layer covering the OLED array, wherein in a first direction, a first projection is located within a second projection, wherein the first projection indicates a first area in the TFT array where the OLED array is projected on the TFT array, the second projection indicates a second area in the TFT array where the package layer is projected on the TFT array, and there is a first distance between a boundary of the first projection and a boundary of the second projection, wherein the first direction is perpendicular to the TFT array substrate;

forming a upper glue layer on a surface of the package layer; the upper glue layer covering the package layer;

forming an upper protection layer on a surface of the upper glue layer; the upper protection layer covering the upper glue layer;

forming a lower glue layer at a side of the TFT array substrate away from the OLED array, wherein, in the first direction, the second projection is located within a third projection, wherein the third projection indicates a third area in the TFT array where the upper protection layer is projected on the TFT array, and there is a second distance between the boundary of the second projection and a boundary of the third projection;

forming a lower protection layer at a side of the lower glue layer away from the TFT array substrate; and forming a first lateral protection layer,
wherein the first lateral protection layer covers and directly contacts with a portion of a surface of the TFT array facing towards the upper protection layer, the portion of the surface of the TFT array is not covered by the upper protection layer,
wherein the first lateral protection layer covers and directly contacts with a portion of a surface of the substrate facing towards the upper protection layer, the portion of the surface of the substrate is not covered by the TFT array,
wherein the first lateral protection layer covers and directly contacts with at least a portion of a surface of the lower glue layer facing towards the upper protection layer, the portion of the surface of the lower glue layer is not covered by the substrate;
wherein, in the first direction, the TFT array encloses the third projection, and there is a fifth distance between a boundary of the third projection and a boundary of the TFT array;
wherein, in the first direction, the substrate encloses a fifth projection wherein the fifth projection indicates a fifth area in the substrate where the TFT array is projected on the substrate, and there is a third distance between a boundary of the fifth projection and a boundary of the substrate of the TFT array substrate;
wherein, in the first direction, the lower protection layer encloses a sixth projection wherein the sixth projection indicates a sixth area in the lower protection layer where the substrate is projected on the lower protection layer, and there is a fourth distance between the boundary of the sixth projection and a boundary of the lower protection layer;
wherein, in the first direction, a seventh projection, wherein the seventh projection indicates a seventh area in the TFT array where the first lateral protection layer is projected on the TFT array, and a boundary of the first lateral protection layer contacts with a boundary of the upper protection layer;
wherein the first direction is perpendicular to the TFT array substrate; wherein the first distance, the second distance, the third distance, the fourth distance and the fifth distance are greater than zero;
wherein the upper protection layer is bonded with the package layer and the TFT array through the upper glue layer, and the lower protection layer is bonded with the substrate through the lower glue layer, wherein the upper protection layer and the upper glue layer are directly contacted, and wherein the third projection of the upper protection layer on the TFT array and an eighth projection are fully overlapped with each other; and
wherein, in the first direction, a boundary of the upper glue layer is flush with a boundary of the upper protection layer, and a boundary of the lower glue layer is flush with a boundary of the lower protection layer.

9. The method according to claim 8, wherein the first distance is greater than 0.3 mm, the second distance is greater than 0.2 mm, the third distance is greater than 0.1 mm, the fourth distance is greater than 0.1, and the fifth distance is greater than 0.1 mm.

10. The method according to claim 8, further comprising forming a second lateral protection layer,
wherein the second lateral protection layer covers the first lateral protection layer.

11. The method according to claim 10, wherein the second lateral protection layer is an $Al_2O_3$ film and the $Al_2O_3$ film is thicker than 0.03 mm.

12. The method according to claim 8, wherein the first lateral protection layer covers an interface between the upper glue layer and the upper protection layer, and
a second lateral protection layer covers an interface between the lower glue layer and the lower protection layer, covers an edge portion of a surface of the lower protection layer away from the lower glue layer, the lower glue layer having a first predetermined width, and covers an edge portion of a surface of the upper protection layer away from the upper glue layer, the upper glue layer having a second predetermined width.

13. The method according to claim 12, wherein the first and second predetermined widths are greater than 0.1 mm and smaller than the fourth distance.

* * * * *